US007388187B1

(12) United States Patent
Liu et al.

(10) Patent No.: US 7,388,187 B1
(45) Date of Patent: Jun. 17, 2008

(54) CROSS-TALK REDUCTION THROUGH DEEP PIXEL WELL IMPLANT FOR IMAGE SENSORS

(75) Inventors: Han-Chi Liu, Dahu Shiang (TW); Chung-Wei Chang, Hsin-Chu (TW); Shou-Gwo Wuu, Hsin-Chu (TW); Tong-Chern Ong, Chong-Her (TW); Chun-Yao Ko, Bade (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/682,428

(22) Filed: Mar. 6, 2007

(51) Int. Cl.
*H01L 31/00* (2006.01)

(52) U.S. Cl. .............................. 250/214.1; 250/208.1; 257/435; 257/222

(58) Field of Classification Search ............. 250/214.1, 250/214 R, 208.1, 371, 510, 183.1, 184–186, 250/215; 257/222, 435
See application file for complete search history.

(56) References Cited

U.S. PATENT DOCUMENTS

| 2005/0127415 | A1* | 6/2005 | Yuzurihara et al. ......... 257/292 |
| 2007/0075338 | A1* | 4/2007 | Park et al. .................. 257/222 |
| 2007/0114629 | A1* | 5/2007 | Dosluoglu et al. .......... 257/435 |

* cited by examiner

*Primary Examiner*—Georgia Y. Epps
*Assistant Examiner*—Francis M Legasse, Jr.
(74) *Attorney, Agent, or Firm*—Haynes Boone LLP

(57) ABSTRACT

An image sensor device includes a semiconductor substrate having a first type of conductivity, a semiconductor layer having the first type of conductivity formed on the semiconductor substrate, and pixels formed in the semiconductor layer. The semiconductor layer includes a first deep well having the first type of conductivity and substantially underlying the plurality of pixels, and a second deep well having a second type of conductivity different from the first type of conductivity and substantially underlying the first deep well.

20 Claims, 8 Drawing Sheets

CROSS-TALK REDUCTION THROUGH DEEP PIXEL WELL IMPLANT FOR IMAGE SENSORS

CROSS REFERENCE

The present disclosure is related to the commonly-assigned U.S. patent application Ser. No. 11/682,401, filed 6 Mar. 2007, entitled "DEVICE AND METHOD TO REDUCE CROSS-TALK AND BLOOMING FOR IMAGE SENSORS," the entire disclosure of which is hereby incorporated herein by reference.

BACKGROUND

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera applications. These devices utilize an array of pixels or image sensor elements, including photodiodes and transistors, to collect photo energy to convert images into electrical signals.

However, image sensor devices suffer from cross-talk. That is, light targeted for one image sensor element (and the electrical signal generated thereby) may spread to neighboring image sensor elements, which causes cross-talk. Cross-talk will degrade spatial resolution, reduce overall optical sensitivity, and result in poor color separation.

Therefore, what is needed is a simple and cost-effective device and method for reducing cross-talk in image sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
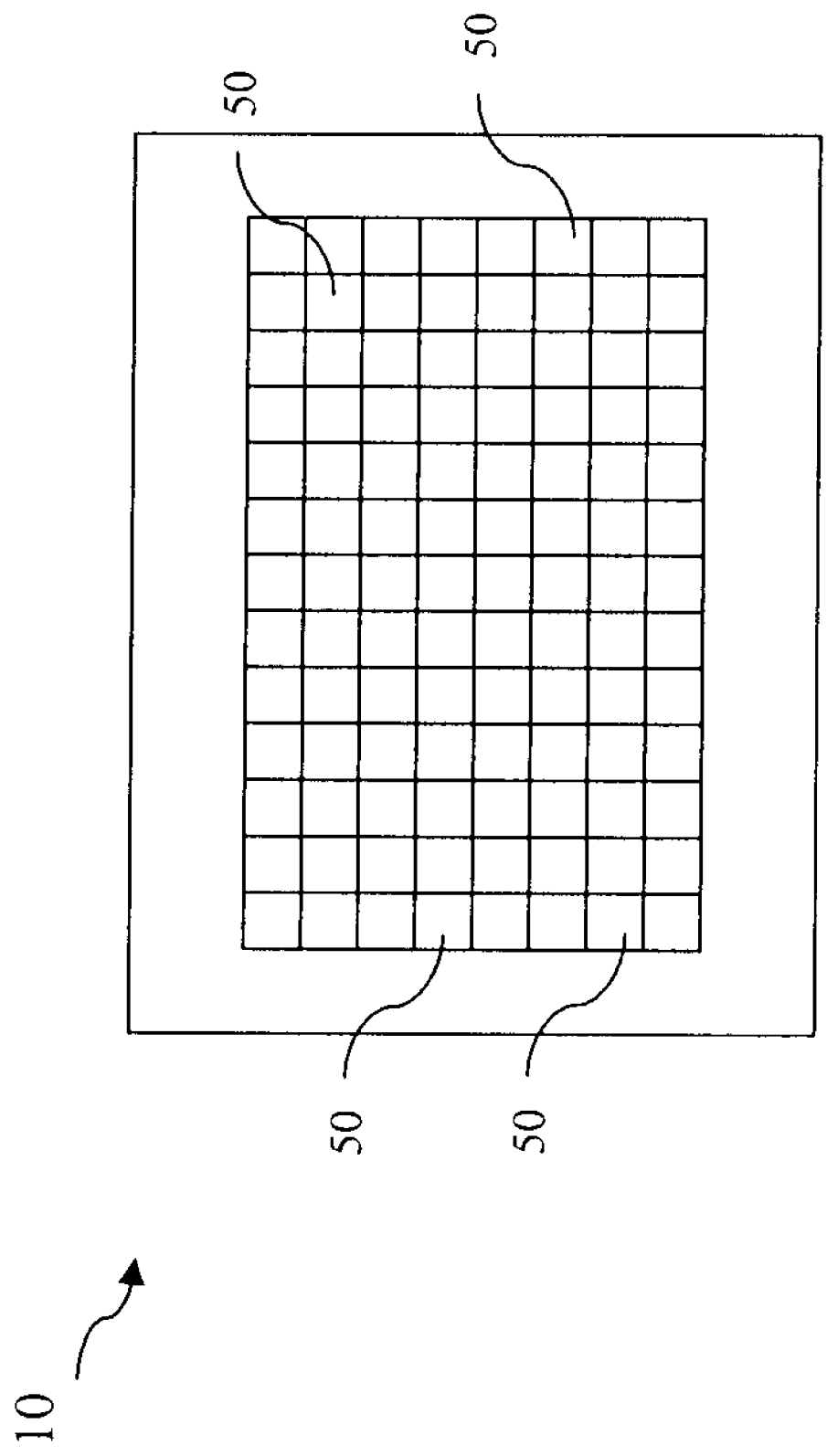
FIG. 1 is a top view of an image sensor including a plurality of pixels according to one or more embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, illustrated is a top view of an image sensor 10 including a grid or array of pixels 50 (sometimes referred to as image sensor elements). Additional circuitry and input/outputs are typically provided adjacent to the grid of pixels 50 for providing an operation environment for the pixels and for supporting external communications with the pixels. The image sensor 10 may include a charge-coupled device (CCD) sensor, complimentary metal oxide semiconductor (CMOS) image sensor (CIS), an active-pixel sensor, and a passive-pixel sensor. Additionally, the image sensor 10 may be a front-side or back-side illuminated sensor.

Figure 2:
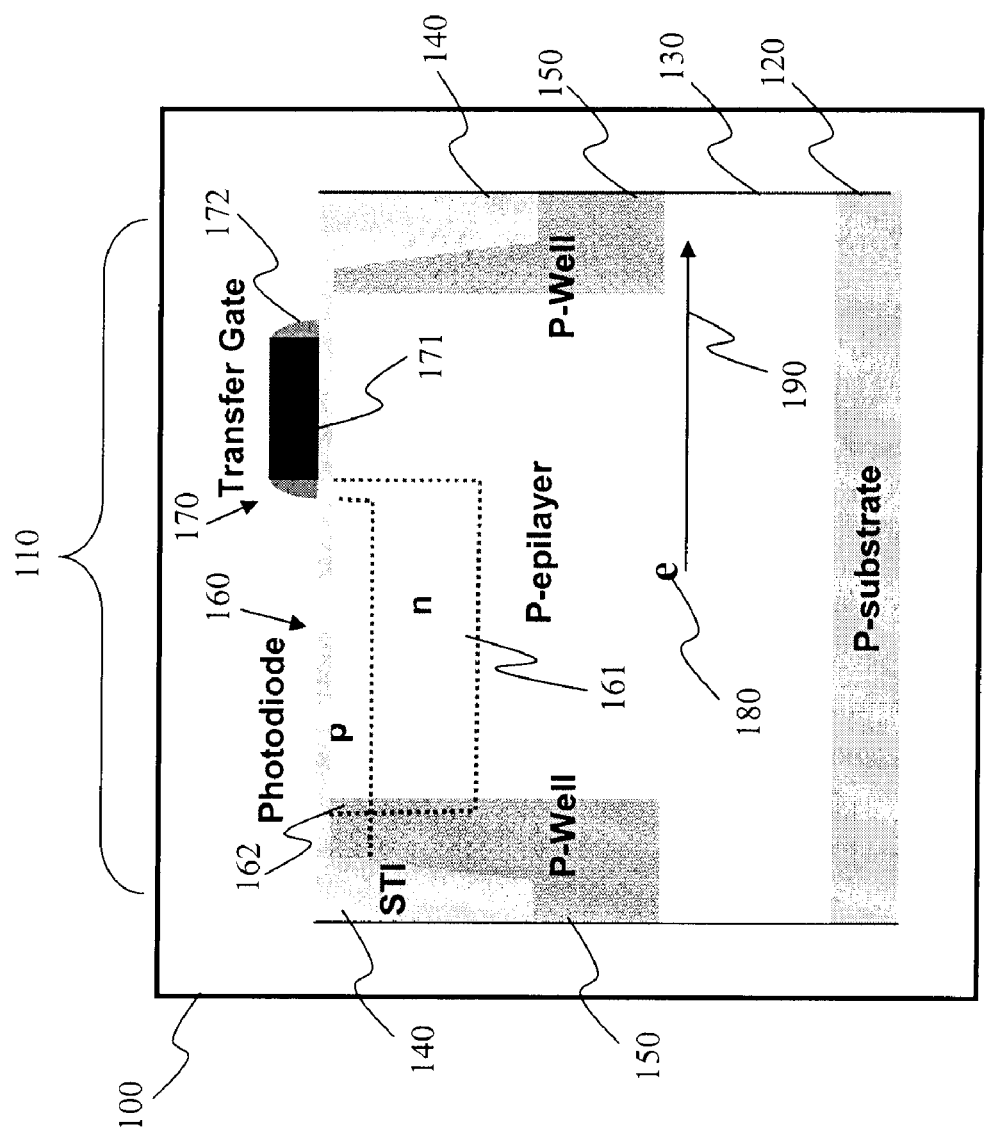
FIG. 2 is a cross-sectional view of an image sensor that suffers from cross-talk.

Referring now to FIG. 2, illustrated is a cross-sectional view of a conventional image sensor 100 that suffers from cross-talk. The image sensor 100 is shown with one unit pixel 110 for simplicity and clarity. The image sensor 100 may comprise a semiconductor substrate 120. The substrate 120 may include a silicon substrate in a crystalline structure. In the present example, the substrate 120 is a heavily doped P-type silicon substrate. The image sensor 100 may further comprise a lightly doped P-type epilayer 130 formed on the P-type silicon substrate 120. The image sensor 100 may further comprise a plurality of isolation features 140 such as shallow trench isolation (STI) features for isolating the pixels formed on the substrate 120. Additionally, the STI features may also isolate other microelectronic devices that may be formed on the substrate 120. The image sensor 100 may further comprise a guard-ring P-type well (P-well) 150 substantially underlying each of the STI features.

The pixel 110 may include a photodiode 160 for sensing an amount of light radiation directed towards the pixel. The photodiode 160 may comprise of an N-type doped region 161 formed in the P-type epilayer 130 and a heavily doped P-type region 162 (also referred to as P-type pinned layer) formed on the surface of the N-type doped region 161. Accordingly, the P-N-P junction region (referred also as the depletion region) makes up the light sensing region of the photodiode 160. The pixel 110 may further include a transfer gate transistor 170 having a gate electrode 171 formed on the P-type epilayer 130. The transfer gate transistor 170 may further include spacers 172 formed on gate electrode 171. It is understood that the transfer gate transistor 170 may include other features such as a source region and drain region which are not illustrated for the sake of clarity.

During operation, incident light may be directed towards the pixel 110 and may reach the photodiode 160. The light that reaches the photodiode 160 may generate optical charges or photo-electrons (e) 180 that are collected and accumulated in the light sensing region. The photo-electrons may be transferred via the transfer gate transistor 170 and may be converted into a digital signal. The amount of photo-electrons generated is proportional to the intensity of the light (e.g., number of photons that are absorbed in the light sensing region). However, since the pixels are narrowly spaced from each other, some of the photo-electrons 180 generated by longer wavelengths of light may spread 190 into adjacent pixels through the epilayer 130 which causes cross-talk. Additionally, the photodiode 160 may have a maximum number of photo-electrons that it can collect and accumulate in the light sensing region. Thus, a blaze of light (very high intensity) may generate an overflow or surplus of photo-electrons 180 that may spread 190 into adjacent pixels through the epilayer 130. As the pixel pitch and scaling continues to shrink, cross-talk issues will become exacerbated.

Figure 3:
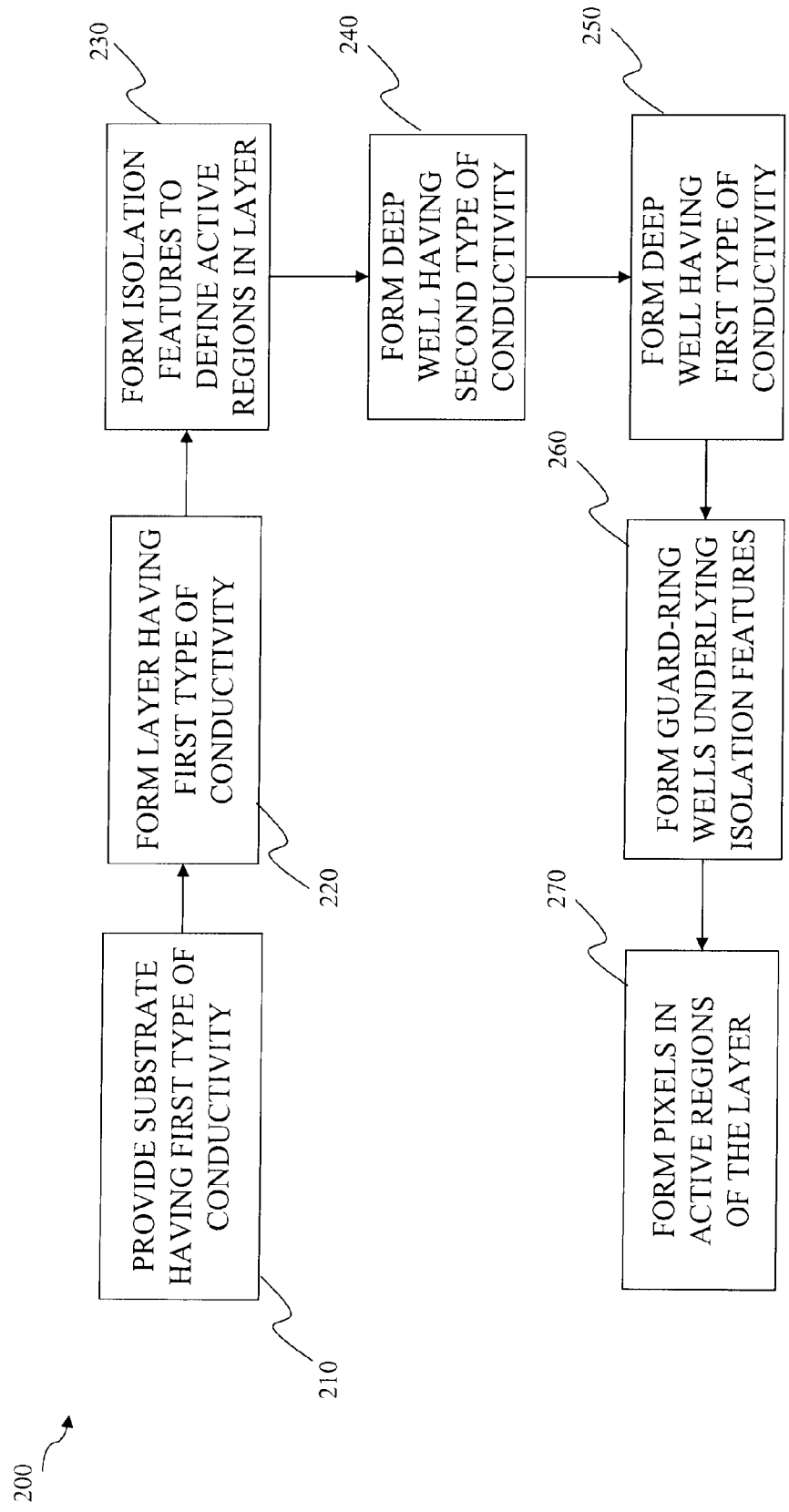
FIG. 3 is a flow chart of a method of fabricating an image sensor according to one or more embodiments of the present disclosure.
Figure 4A:
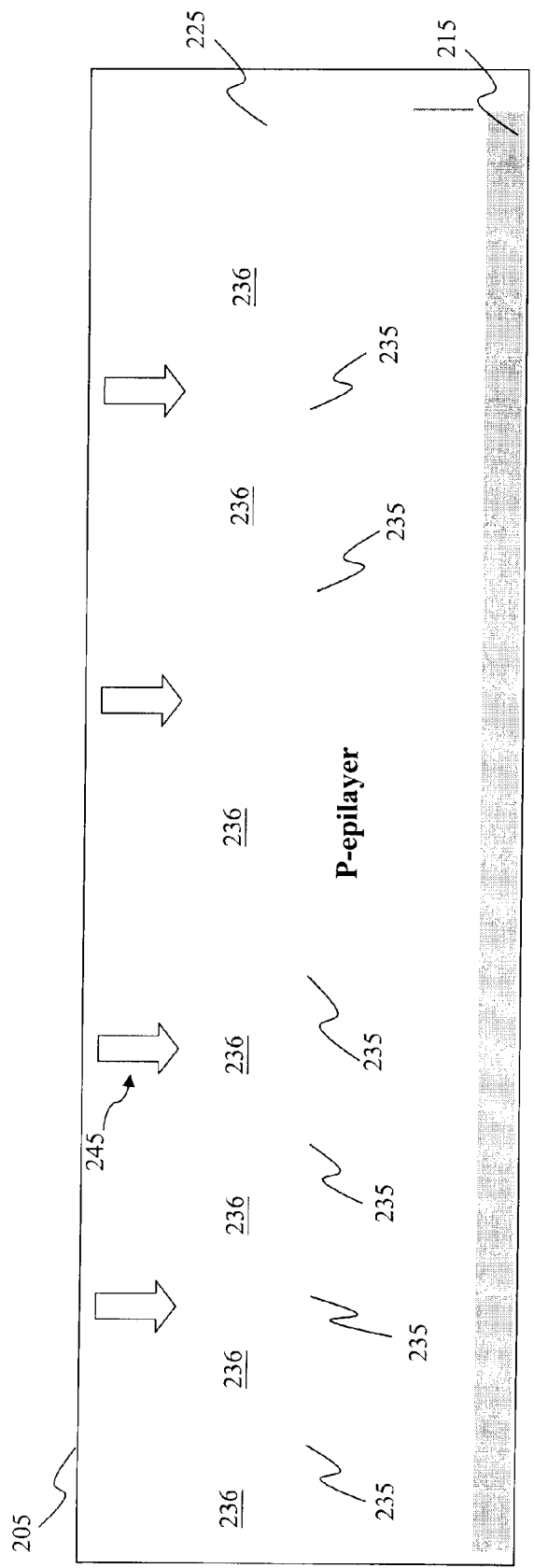
FIGS. 4A-4D are cross-sectional views of an image sensor being processed according to the method of FIG. 3.

Referring now to FIG. 3, illustrated is a flow chart of a method 200 for fabricating an image sensor 205 that reduces cross-talk according to one or more embodiments of the present disclosure. Referring also to FIGS. 4A to 4D, illustrated are cross-sectional views of an image sensor 205 being processed according to the method 200 of FIG. 3. In FIGS. 3 and 4A, the method 200 begins with step 210 in which a semiconductor substrate 215 having a first type of conductivity may be provided. The semiconductor substrate 215 may include a silicon having a crystalline structure. The substrate 215 may also include other elementary semiconductors such as germanium. Alternatively, the substrate 215 may optionally include a compound semiconductor such as silicon carbide, gallium arsenic, indium arsenide, and indium phosphide. In the present embodiment, the substrate 215 may include silicon having a first type of conductivity such as a P-type silicon substrate. The P-type silicon substrate may be formed by heavily doping the silicon with an P-type dopant, such as boron, $BF_2$, or other suitable material. The doping may be implemented by an ion implantation or a diffusion process known in the art.

The method 200 continues with step 220 in which a semiconductor layer 225 may be formed on the semiconductor substrate 215. The semiconductor layer 225 may include an epilayer having the first type of conductivity such as a P-type epilayer (P-epilayer). The P-epilayer may be formed by an epitaxial growth process. The P-epilayer may be configured to have a lower concentration of the P-type dopant than the P-type silicon substrate.

The method 200 continues with step 230 in which a plurality of isolation features 235 such as shallow trench isolation (STI) features may be formed in the semiconductor layer 225. The isolation features 235 may define and isolate active regions 236 in the semiconductor layer 225 that may used to form various devices on the substrate 215. The isolation features 235 may be formed in the P-epilayer by a suitable process known in the art. For example, the STI features may be formed by patterning the semiconductor layer 225 by photolithography, etching the semiconductor layer by plasma etching to form various trenches, and filling the trenches with a dielectric material such as silicon oxide. Additionally, the STI features may further include an oxide layer lining the side walls.

Figure 4B:
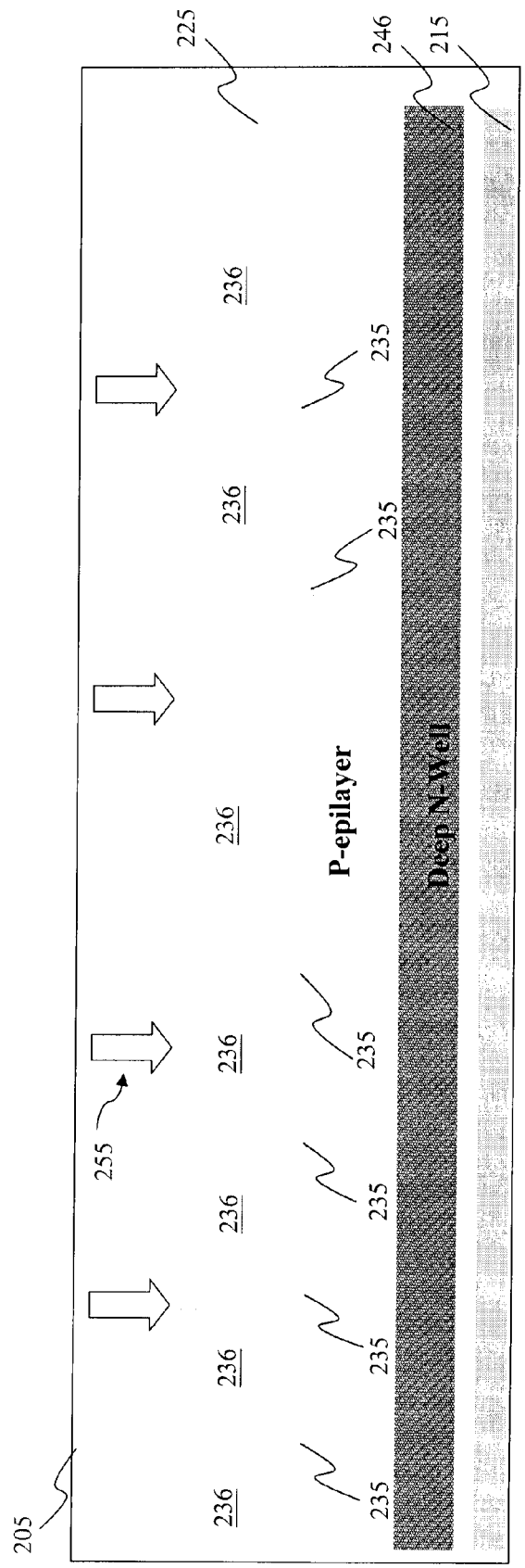

The method 200 continues with step 240 in which an ion implantation 245 may be performed by an implanter to form a deep well in the semiconductor layer 225. The ion implantation 245 may utilize a dopant of a second type of conductivity different from the first type of conductivity. In the present embodiment, the dopant includes an N-type dopant, such as phosphorous, arsenic, or other suitable material. The dosage of the N-type dopant may range from 1E11 to about 1E13 atoms/cm$^2$. The implanter may be configured to provide an energy ranging from 2000 KeV to about 4000 KeV in order to from the deep well. In FIG. 4B, after ion implantation 245 in step 240, a deep N-type well (N-well) 246 may be formed in the P-epilayer.

Figure 4C:
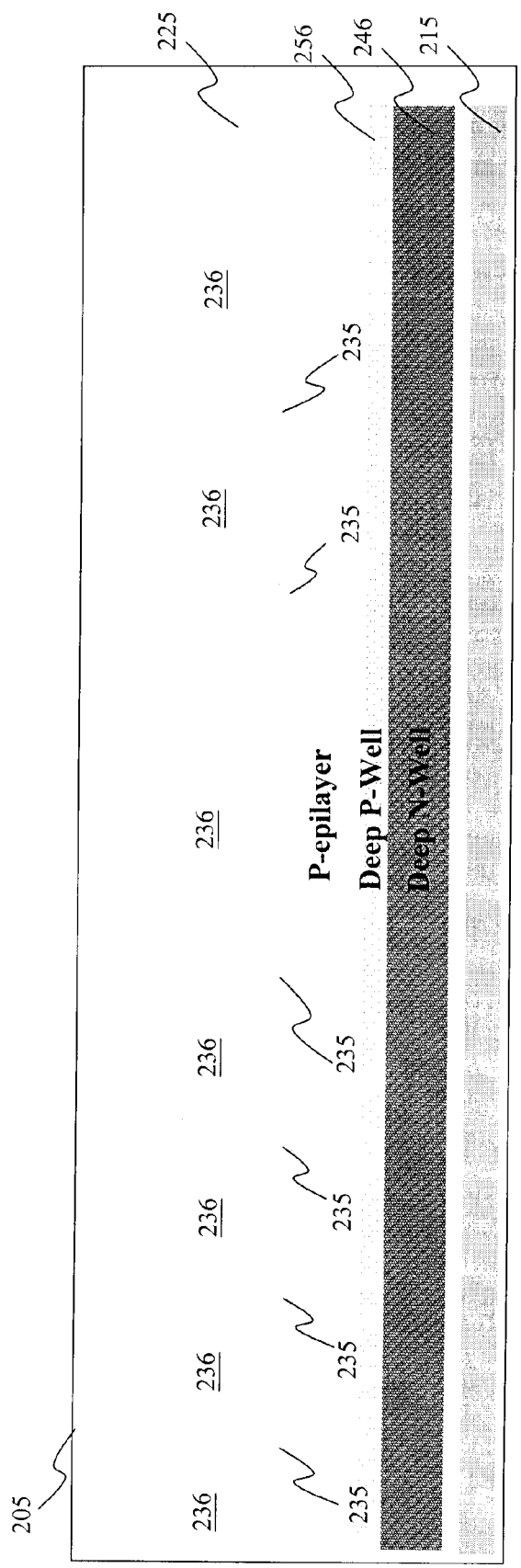

In FIGS. 3 and 4B, the method 200 continues with step 250 in which another ion implantation 255 may be performed by an implanter to form another deep well in the semiconductor layer 225. The ion implantation 255 may utilize a dopant of a first type of conductivity. In the present embodiment, the dopant includes an P-type dopant, such as boron, $BF_2$, or other suitable material. The dosage of the P-type dopant may range from 1E11 to about 1E12 atoms/cm$^2$. The implanter may be configured to provide an energy ranging from 1000 KeV to about 2000 KeV in order to from the deep well. In FIG. 4C, after ion implantation 255 in step 250, a deep P-type well (P-well) 256 may be formed in the P-epilayer.

It is understood that the energy ranges and dosages used to form the deep N-well 246 and deep P-well 256 are mere examples and that these values may vary depending the image sensor design. In the present embodiment, the deep N-well 246 substantially underlies the deep P-well 256 and both wells substantially underlie the plurality of isolation features 235.

Figure 4D:
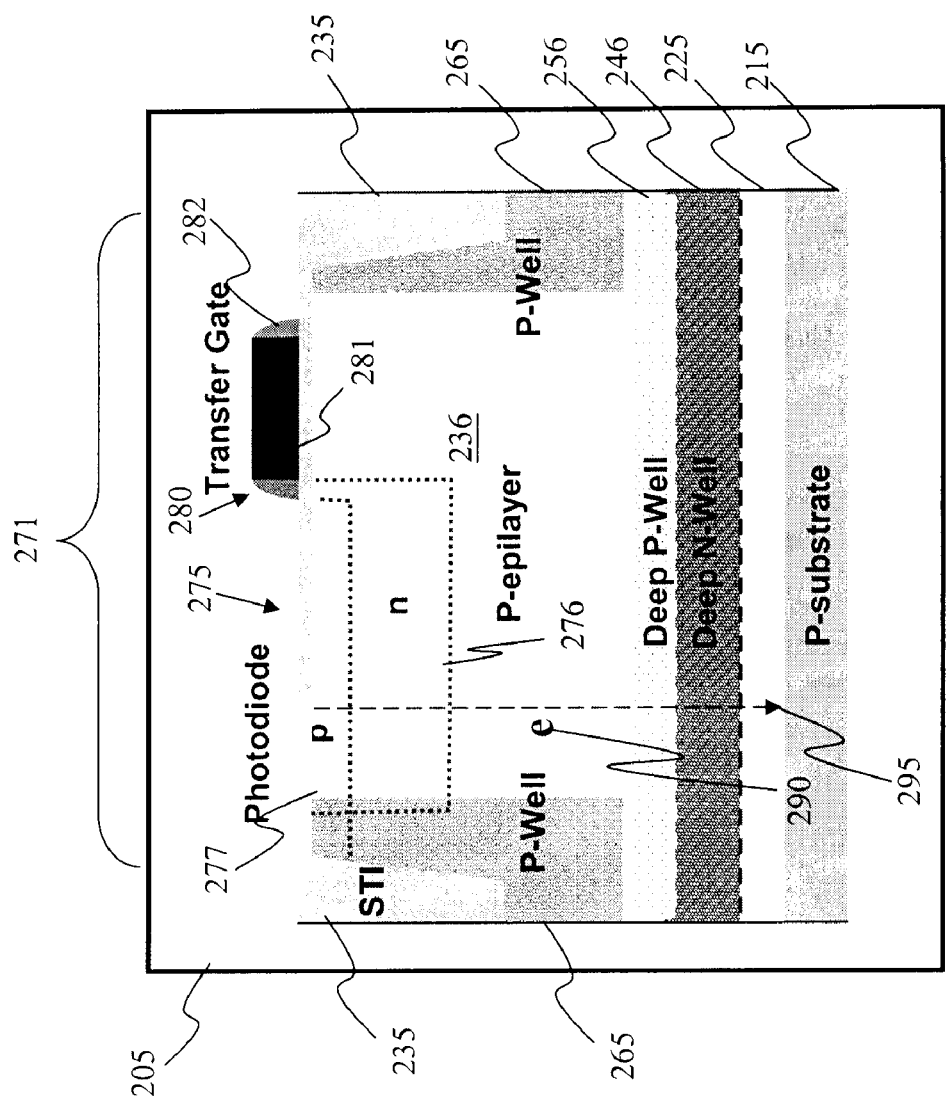

In FIGS. 3 and 4D (FIG. 4D illustrates only one unit pixel for simplicity and clarity), the method 200 continues with step 260 in which a plurality of guard-ring wells 265 may be formed in the semiconductor layer 215. The guard-ring well 265 may be formed by ion implantation over the isolation feature 235 with an implanter. The ion implantation may be performed at a tilt angle from 0 to about 90 degrees. Since the semiconductor substrate 215, in the present embodiment, is a P-type silicon substrate, P-type dopant such as boron, may be implanted below the isolation features 235 to form a guard-ring P-type well (P-well). It is understood that the energy range to form the guard-ring wells 265 may vary depending on the desired depth of the guard-ring wells. By implanting ions with different energy values, different penetration depths may be achieved. For example, a higher energy value may provide a deep implantation in the center of the guard-ring P-well and a lower energy value may provide a shallow implantation for the guard-ring P-well around the sidewall of the isolation features 235.

The method 200 continues with step 270 in which a plurality of pixels 271 may be formed in the active regions 236 of the semiconductor layer 225. It is understood that only one unit pixel 271 is disclosed herein for simplicity and clarity. The pixel 271 may include a photodiode 275 formed in the semiconductor layer 225 for sensing an amount of light radiation. In the present embodiment, the photodiode 275 is an N-type photodiode. The photodiode 275 may comprise an N-type doped region 276 formed in the P-epilayer. The photodiode 275 may further comprise a P-type pinned layer 277 formed over the surface of the N-type photodiode. Accordingly, the P-N-P junction region (also referred as the depletion region) may make up the light sensing region of the photodiode 275. Another example of a photodiode that can be used is shown in U.S. patent application Ser. No. 11/291,880, filed on Dec. 1, 2005, which is hereby incorporated by reference. Alternatively, other types of light sensing elements may optionally be used such as a photogate and photo transistor.

The pixel 271 may further include a transfer gate transistor 280 having a gate electrode 281 formed on the semiconductor layer 225. The transfer gate transistor 280 may further include sidewall spacers 282 formed on the gate electrode 281. It is understood that the transfer gate transistor 280 may include other features such as a source and drain region which are not illustrated for the sake of simplicity and clarity. Additionally, other microelectronic elements may be formed in the semiconductor layer 225 to provide an operation environment for the pixel. These microelectronic elements include, but are not limited, a reset gate transistor, source follower transistor, row select transistor, and other types of transistors.

The image sensor 205 may further comprise a plurality of interconnect metal layers (not shown) for providing connections between the various microelectronic elements of the image sensor. The interconnect metal layers may include conductive materials such as aluminum, aluminum/silicon/copper alloy, titanium, titanium nitride, tungsten, polysilicon, metal silicide, or combinations thereof. The interconnects may be formed by a process including physical vapor deposition (or sputtering), chemical vapor deposition (CVD), or other suitable technique. Alternatively, the interconnect metal layers may include copper, copper alloy, titanium, titanium nitride, tantalum, tantalum nitride, tungsten, polysilicon, metal silicide, or combinations thereof.

The interconnect metal layers may be disposed and insulated in an interlayer dielectric. The interlayer dielectric may include a material of a low dielectric constant such as a dielectric constant less than about 3.5. The interlayer dielectric may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, SiLK (Dow Chemical, Midland, Mich.), polyimide, and/or other suitable materials. The interlayer dielectric may be formed by a technique including spin-on, CVD, or sputtering. Additionally, the interconnect metal layer and interlayer dielectric may be formed in an integrated process such as a damascene process or lithography/plasma etching process.

The image sensor 205 may further comprise a color filter and a microlens (not shown). The location of the color-filter and microlens will depend on whether the image sensor is configured as a front-side or back-side illuminated image sensor. During operation, the color filter and microlens are configured to filter through a desired type of light radiation (e.g., red, green, blue light) and direct it towards the light sensing region (P-N-P junction region) of the photodiode 275. The light radiation that is absorbed in the light sensing region may generate optical charges or photo-electrons (e) 290 which may be collected and accumulated by the photodiode 275. The amount of photo-electrons 290 generated may be proportional to the intensity of the light radiation. These photo-electrons 290 may be transferred via the transfer gate transistor 280 and may be converted to a digital signal by the other microelectronic elements formed on the substrate 215.

In some circumstances, the photo-electrons 290 generated in one pixel may spread into an adjacent pixel through the P-epilyer which causes cross-talk. The photo-electrons 290 may be generated by longer wavelengths of light which are absorbed deeper in the photodiode 275. Additionally, an overflow or surplus of photo-electrons 290 may be generated by a blaze of light (high intensity) which exceeds the full well capacity of the photodiode 275. However, the junction area between the deep P-well 256 and the deep N-well 246 provides a depletion region where these photo-electrons can be collected and therefore, greatly reduces cross-talk between the pixels. Additionally, the deep P-well 256 and the deep N-well 246 configuration does not degrade device performance. For example, operating parameters such as the pinned voltage and full well capacity of the photodiode 275 remain essentially unchanged with this configuration.

Figure 5:
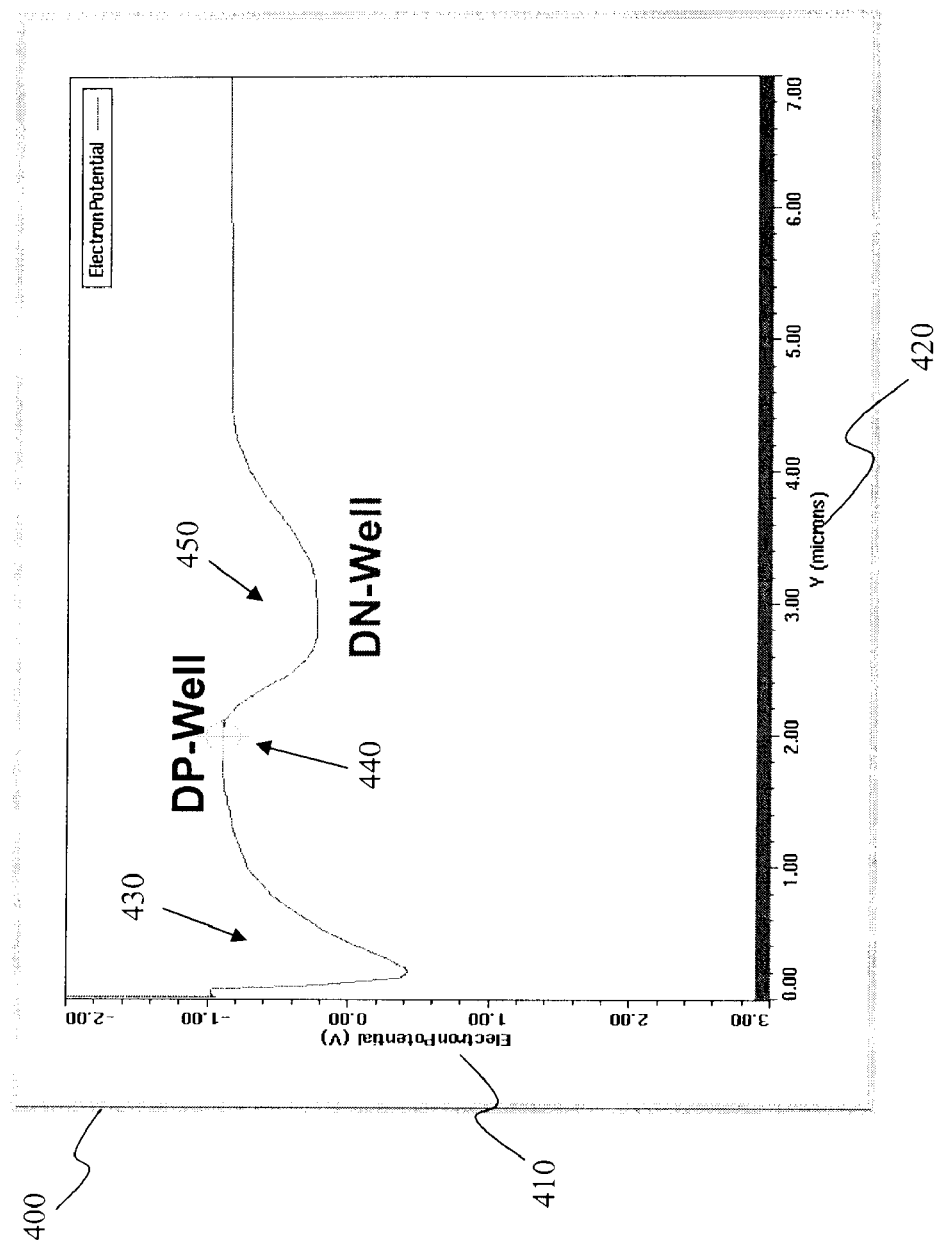
FIG. 5 is a graph showing a relationship between an electron potential measured along a depth of the image sensor of FIG. 4D.

Referring now also to FIG. 5, illustrated is a graph 400 showing an electron potential measured along a depth 295 (FIG. 4D) of the image sensor 205. The graph 400 includes an X-axis 410 indicating the electron potential in volts and a Y-axis 420 indicating the depth of the image sensor in microns. As shown in the graph 400, the photo-electrons that are generated may be collected and accumulated in the depletion region 430 (P-N-P junction region) of the photodiode. In some situations, longer wavelengths of light may generate photo-electrons deeper in the pixel area 440. These photo-electrons may be prevented from spreading into other adjacent pixels by another depletion region 450 created at the junction of the deep P-well and deep N-well. That is, photo-electrons that may want to spread into other adjacent pixels are instead collected in this depletion region 450. Additionally, in situations where the full well capacity of the photodiode is exceeded, the surplus photo-electrons may also be collected in this depletion region 450.

In the disclosed image sensors and the method to make the same, the light radiation that may be received during operation may not be limited to visual light (e.g., red, green, blue light), but can be extended to other types of light radiation such as infrared (IR) and ultraviolet (UV) light. Accordingly, the pixels and various other devices may be properly designed and configured for effectively reflecting and/or absorbing the corresponding light radiation beam.

Thus, the present disclosure provides an image sensor device. The image sensor device includes a semiconductor substrate having a first type of conductivity, a semiconductor layer, having the first type of conductivity, formed on the semiconductor substrate, and a plurality of pixels formed in the semiconductor layer. The semiconductor layer includes a first deep well having the first type of conductivity and substantially underlying the plurality of pixels, and a second deep well having a second type of conductivity different from the first type of conductivity and substantially underlying the first deep well. In some embodiments, the image sensor device further includes, a plurality of shallow trench isolation (STI) features formed in the semiconductor layer and a plurality of guard-ring wells having the first type of conductivity. Each STI feature is disposed between the plurality of pixels and each guard-ring well substantially underlies each STI feature.

In other embodiments, each pixel includes a light sensing element and at least one transistor. In some embodiments, the light sensing element is a photodiode. In some embodiments, the light sensing element is a pinned layer photodiode. In some embodiments, the light sensing element is a photogate. In still other embodiments, the light sensing element is a photo transistor. In some embodiments, the at least one transistor is selected form a group consisting of: a transfer gate transistor, a reset gate transistor, a source follower transistor, a row select transistor, and combinations thereof.

In some other embodiments, the semiconductor substrate has a higher doping concentration of a dopant of the first type of conductivity than the semiconductor layer. In other embodiments, the first deep well is formed by an ion implantation process with an energy range from 1000 to about 2000 KeV. In other embodiments, the first deep well is formed with a dosage of a dopant of the first type of conductivity from 1E11 to about 1E12 atoms/cm$^2$. In still other embodiments, the second deep well is formed by an ion implantation process with an energy range from 2000 to about 4000 KeV. In some embodiments, the second deep well is formed with a dosage of a dopant of the second type of conductivity from 1E11 to about 1E13 atoms/cm$^2$.

Also, the present disclosure provides a method for fabricating an image sensor semiconductor device. The method includes providing a semiconductor substrate having a first type of conductivity, forming a semiconductor layer having the first type of conductivity on the semiconductor substrate, forming a first deep well and a second deep well in the semiconductor layer, the first deep well substantially overlying the second deep well, and forming a plurality of pixels in the semiconductor layer substantially overlying the first deep well. The first deep well is configured to have the first type of conductivity and the second deep well is configured to have a second type of conductivity different from the first type of conductivity. In some embodiments, the step of forming the semiconductor layer includes epitaxially growing an epilayer having a lower concentration of a dopant of the first type of conductivity than the semiconductor substrate.

In some other embodiments, the step of forming the first deep well includes is performing an ion implantation process with an energy range from 1000 to about 2000 KeV and a dosage of a dopant of the first type of conductivity from 1E11 to about 1E12 atoms/cm$^2$. In still other embodiments, the step of forming the second deep well includes performing an ion implantation process with an energy range from 2000 to about 4000 KeV and a dosage of a dopant of the second type of conductivity from 1E11 to about 1E13 atoms/cm$^2$. In other embodiments, the method further includes forming a plurality of shallow trench isolation (STI) features in the semiconductor layer and forming a plurality of guard-ring wells having the first type of conductivity. Each STI feature is disposed between the plurality of pixels and each guard-ring well substantially underlies each STI feature. In other embodiments, the step of forming the plurality of pixels includes configuring each pixel to include a photodiode and at least one transistor.

Additionally, the present disclosure provides a semiconductor device including a substrate having a first type of dopant, a layer having the first type of dopant formed on the substrate, and a plurality of sensor elements formed in the layer. The layer includes a first deep well, having the first type of dopant, substantially underlying the plurality of sensor elements, and a second deep well, having a second type of dopant different from the first type of dopant, substantially underlying the first deep well. In some embodiments, each sensor element includes a photodiode and at least one transistor. In some other embodiments, the substrate has a higher concentration of the first type of dopant than the layer. In still other embodiments, the semiconductor device further includes a plurality of isolation features formed in the layer for isolating the plurality of sensor elements from each other and a plurality of guard-ring wells, each guard-ring well surrounds each isolation feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above listed processing steps can be used in combination or in parallel. Also, features illustrated and discussed in some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure. For example, various features and the doping configurations disclosed herein may be reversed accordingly.

Several different advantages exist from these and other embodiments. In addition to providing an efficient and cost-effective device and method for reducing cross-talk and/or blooming in image sensors, the device and method disclosed herein can easily be integrated with current semiconductor processing equipment and techniques. Additionally, the device and method disclosed herein can be implemented to achieve device performance that is comparable to current image sensors. Furthermore, the device and method disclosed herein may be implemented even as pixel scaling continues to shrink with emerging technologies.

What is claimed is:

1. An image sensor device, comprising:
   a semiconductor substrate having a first type of conductivity;
   a semiconductor layer, having the first type of conductivity, formed on the semiconductor substrate;
   a plurality of shallow trench isolation (STI) features formed in the semiconductor layer, wherein each of the plurality of STI features is disposed between the plurality of pixels;
   a plurality of guard-ring wells having the first type of conductivity, wherein each of the plurality of guard-ring wells substantially underlies each of the plurality of STI features; and
   a plurality of pixels formed in the semiconductor layer, wherein the plurality of pixels include at least one photodiode;
   wherein the semiconductor layer comprises a first deep well having the first type of conductivity, and substantially underlying the plurality of pixels and directly underlying the at least one photodiode, and a second deep well having a second type of conductivity different from the first type of conductivity and substantially underlying the first deep well.

2. The device of claim 1, wherein each of the plurality of pixels includes a light sensing element and at least one transistor.

3. The device of claim 2, wherein the light sensing element is selected from a group consisting of: a photodiode, pinned layer photodiode, photogate, and photo transistor.

4. The device of claim 3, wherein the at least one transistor is selected from a group consisting of: a transfer gate transistor, a reset gate transistor, a source follower transistor, a row select transistor, and combinations thereof.

5. The device of claim 1, wherein the semiconductor substrate has a higher doping concentration of a dopant of the first type of conductivity than the semiconductor layer.

6. The device of claim 1, wherein the first deep well is formed by an ion implantation process with an energy range from 1000 to about 2000 KeV.

7. The device of claim 6, wherein a dosage of a dopant of the first type of conductivity is from 1E11 to about 1E12 atoms/cm$^2$.

8. The device of claim 1, wherein the second deep well is formed by an ion implantation process with an energy range from 2000 to about 4000 KeV.

9. The device of claim 8, wherein a dosage of a dopant of the second type of conductivity is from 1E11 to about 1E13 atoms/cm$^2$.

10. A method for making an image sensor, comprising:
    providing a semiconductor substrate having a first type of conductivity;
    forming a semiconductor layer, having the first type of conductivity, on the semiconductor substrate;
    forming a first deep well and a second deep well buried in the semiconductor layer such that a first portion of the semiconductor layer overlies the first deep well and a second portion of the semiconductor layer underlies the first deep well, the first deep well substantially overlying the second deep well; forming a plurality of pixels in the semiconductor layer substantially overlying the first deep well and wherein the first deep well directly underlies at least one photodiode;

forming a plurality of shallow trench isolation (STI) features in the semiconductor layer, wherein each of the plurality of STI features is disposed between the plurality of pixels and overlie the first deep well;

forming a plurality of guard-ring wells having the first type of conductivity, wherein each of the plurality of guard-ring wells substantially underlies each of the STI features; and wherein the forming the first deep well includes configuring the first deep well to have the first type of conductivity and the forming the second deep well includes configuring the second deep well to have a second type of conductivity different from the first type of conductivity.

11. The method of claim 10, wherein the forming the semiconductor layer includes epitaxially growing an epilayer having a lower concentration of a dopant of the first type of conductivity than the semiconductor substrate.

12. The method of claim 10, wherein the forming the first deep well includes performing an ion implantation process with an energy range from 1000 to about 2000 KeV and a dosage of a dopant of the first type of conductivity from 1E11 to about 1E12 atoms/cm$^2$.

13. The method of claim 10, wherein the forming the second deep well includes performing an ion implantation process with an energy range from 2000 to about 4000 KeV and a dosage of a dopant of the second type of conductivity from 1E11 to about 1E13 atoms/cm$^2$.

14. The method of claim 10, wherein the forming the plurality of pixels includes configuring each of the plurality of pixels to include a photodiode and at least one transistor.

15. A semiconductor device, comprising:
a substrate having a first type of dopant;
a layer, having the first type of dopant, formed on the substrate; and
a plurality of sensor elements formed in the layer;
a plurality of isolation features formed in the layer for isolating the plurality of sensor elements from each other; a plurality of guard-ring wells, wherein each of the plurality of guard-ring wells surrounds each of the plurality of isolation features,
a first deep well, having the first type of dopant, substantially underlying the plurality of sensor elements and directly underlying at least one photodiode; and
a second deep well, having a second type of dopant different from the first type of dopant, substantially underlying the first deep well, wherein the first deep well and the second deep well substantially underlie the plurality of isolation features.

16. The device of claim 15, wherein each of the plurality of sensor elements includes a photodiode and at least one transistor.

17. The device of claim 15, wherein the substrate has a higher concentration of the first type of dopant than the layer.

18. The device of claim 1, wherein the at least one photodiode includes a first photodiode and a second photodiode and the first deep well underlies both the first and the second photodiode.

19. The device of claim 15, wherein the photodiode includes a first doped region formed in the substrate, a second doped region formed in the substrate, and at least a portion of the layer; and wherein the first deep well underlies the photodiode including the at least a portion of the layer.

20. The device of claim 1, wherein the first deep well and the second deep well underlie the STI features.

* * * * *